（12） United States Patent
Sinofsky et al.

(10) Patent No.: US 11,396,985 B2
(45) Date of Patent: Jul. 26, 2022

(54) PCB INTERCONNECT SCHEME FOR CO-PLANAR LED STRIPS

(71) Applicant: Illumina, Inc., San Diego, CA (US)

(72) Inventors: Brian Elliot Sinofsky, San Diego, CA (US); Michael Justin Wright, San Diego, CA (US); Lim Peng Huay, Singapore (SG); Low Hong Yeap, Singapore (SG); Voon Yeow Seng, Singapore (SG)

(73) Assignee: Illumina, Inc., San Diego, CA (US)

( * ) Notice: Subject to any disclaimer, the term of this patent is extended or adjusted under 35 U.S.C. 154(b) by 44 days.

(21) Appl. No.: 17/005,066

(22) Filed: Aug. 27, 2020

(65) Prior Publication Data

US 2021/0071830 A1    Mar. 11, 2021

Related U.S. Application Data

(60) Provisional application No. 62/897,203, filed on Sep. 6, 2019.

(30) Foreign Application Priority Data

Nov. 28, 2019  (NL) ..................................... 2024328

(51) Int. Cl.
*F21S 4/00* (2016.01)
*F21S 4/28* (2016.01)
(Continued)

(52) U.S. Cl.
CPC ................ *F21S 4/28* (2016.01); *F21V 23/06* (2013.01); *H01R 12/714* (2013.01); *H01R 13/24* (2013.01);
(Continued)

(58) Field of Classification Search
CPC ........ F21V 23/06; H05K 1/119; H05K 1/181; H01R 12/714; H01R 43/26; H01R 13/24; H01R 13/631; F21S 4/28
See application file for complete search history.

(56) References Cited

U.S. PATENT DOCUMENTS 6,603,079 B2 * 8/2003 Biron ..................... H05K 1/148
174/254
7,085,146 B2 * 8/2006 Pitzele ................. H05K 3/3447
363/147
(Continued)

FOREIGN PATENT DOCUMENTS

DE     202012103264        12/2013
DE     202012103264 U1 *   12/2013    ............ F21V 19/004

OTHER PUBLICATIONS

Dutch Search Report dated Aug. 19, 2020, in NL 2024328.
(Continued)

*Primary Examiner* — Gerald J Sufleta, II
(74) *Attorney, Agent, or Firm* — Weaver Austin Villeneuve & Sampson LLP

(57) ABSTRACT

LED board interconnect schemes for illuminable assemblies are provided. Multiple LED boards may form a partial perimeter along an illuminable assembly. The multiple LED boards and interconnects must fit within a limited width and height of the illuminable assembly. In some implementations, an interconnect board and spring connectors are used to provide a low-profile electrical interconnection while maintaining co-planarity of the LEDs across the LED boards.

20 Claims, 9 Drawing Sheets

(51) Int. Cl.
  *H01R 12/71* (2011.01)
  *H05K 1/11* (2006.01)
  *H01R 13/24* (2006.01)
  *H05K 1/18* (2006.01)
  *H01R 13/631* (2006.01)
  *F21V 23/06* (2006.01)
  *H01R 43/26* (2006.01)
  *F21Y 103/10* (2016.01)
  *F21Y 115/10* (2016.01)

(52) U.S. Cl.
  CPC .......... *H01R 13/631* (2013.01); *H01R 43/26* (2013.01); *H05K 1/119* (2013.01); *H05K 1/181* (2013.01); *F21Y 2103/10* (2016.08); *F21Y 2115/10* (2016.08); *H05K 2201/09018* (2013.01); *H05K 2201/09063* (2013.01); *H05K 2201/10106* (2013.01)

(56) References Cited

U.S. PATENT DOCUMENTS

| | | | | |
|---|---|---|---|---|
| 7,304,373 | B2* | 12/2007 | Taggart | H01L 23/50 174/254 |
| 7,462,036 | B2 | 12/2008 | Shin et al. | |
| 7,618,283 | B1* | 11/2009 | Costello | H01R 12/585 439/511 |
| 7,892,022 | B2 | 2/2011 | Mostoller et al. | |
| 7,959,445 | B1* | 6/2011 | Daily | H01R 12/716 439/65 |
| 8,297,788 | B2 | 10/2012 | Bishop | |
| 9,160,086 | B2 | 10/2015 | Swedberg | |
| 2009/0267533 | A1* | 10/2009 | Lee | F21S 4/28 315/294 |
| 2010/0112833 | A1 | 5/2010 | Jeon | |
| 2010/0142205 | A1* | 6/2010 | Bishop | F21V 21/00 362/249.02 |
| 2014/0024249 | A1* | 1/2014 | Adams | F21V 21/005 439/509 |
| 2014/0292214 | A1* | 10/2014 | Huang | H05B 45/395 315/192 |
| 2016/0172786 | A1* | 6/2016 | Sussman | H01R 43/048 439/449 |
| 2018/0295711 | A1* | 10/2018 | Heikkinen | H05K 3/28 |
| 2019/0024858 | A1* | 1/2019 | Kim | F21S 4/28 |
| 2021/0092846 | A1* | 3/2021 | Kieslinger | F21S 45/47 |
| 2021/0202813 | A1* | 7/2021 | Hin | H01L 33/62 |
| 2021/0273391 | A1* | 9/2021 | Daniels | H01R 43/26 |
| 2021/0343915 | A1* | 11/2021 | Liu | H01L 33/62 |

OTHER PUBLICATIONS

International Search Report and Written Opinion dated Nov. 10, 2020, in PCT/US2020/048248.
10 mm RGB In-Channel LED Strip Joiner, Google Express, dated Aug. 6, 2019, 2 pages.
5050 LED Strip Gapless Connector 10 mm 2 pin for Single Color LED Strip Lights, LED Tape Connector Board To Board, Strip to Strip Joint, superlightingled.com, dated Aug. 9, 2019, 4 pages.
L/ T/+Shape 2Pin Single Color LED Strip Lights Fast Conector to 2pin Single Color LED Tape Lights Fast Connector Accessories, superlightingled.com, dated Aug. 9, 2019, 2 pages.

* cited by examiner

PCB INTERCONNECT SCHEME FOR CO-PLANAR LED STRIPS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Light-emitting diodes (LEDs) may be used as part of an assembly to provide lighting and illumination effects in a device. LEDs may be placed upon printed circuit boards (PCBs) and connected together. In some applications, multiple LED-containing PCBs may be used and may be electrically connected together end-to-end.

SUMMARY

The present disclosure provides new techniques and apparatuses for improving the design and construction of interconnect assemblies between LED boards.

Details of one or more implementations of the subject matter described in this specification are set forth in the accompanying drawings and the description below. Other features, aspects, and advantages will become apparent from the description, the drawings, and the claims. The following, non-limiting implementations are considered part of the disclosure; other implementations will be evident from the entirety of this disclosure and the accompanying drawings as well.

In some implementations, a light-emitting diode (LED) lighting strip assembly may be provided that includes a first LED board, a second LED board, and an interconnect board. The first LED board may include a first printed circuit board (PCB) substrate with a first side and a second side opposite the first side of the first PCB substrate, a plurality of LEDs located on the first side of the first PCB substrate, where each LED emits light away from the first side of the first LED board, an end portion, and a plurality of compressible electrically conductive members that each extend outward from the second side of the first PCB substrate. Similarly, the second LED board may include a second PCB substrate with a first side and a second side opposite the first side of the second PCB substrate, a plurality of LEDs located on the first side of the second PCB substrate, where each LED emits light away from the first side of the second LED board, an end portion, and a plurality of compressible electrically conductive members that each extend outward from the second side of the second PCB substrate. The interconnect board may include a third PCB substrate having a first region and a second region. The third PCB substrate may include a plurality of first electrically conductive pads located on a first side of the third PCB substrate and within the first region of the third PCB substrate, and a plurality of second electrically conductive pads located on the first side of the third PCB substrate and within the second region of the third PCB substrate; each first electrically conductive pad may be electrically connected with at least one of the second electrically conductive pads by an electrically conductive trace of the interconnect board. In such implementations, the end portion of the first LED board may be proximate to the end portion of the second LED board, the first side of the third PCB substrate may face the second side of the first LED board and the second side of the second LED board, each compressible electrically conductive member of the first LED board may be in electrically conductive contact with a corresponding one of the first electrically conductive pads, each compressible electrically conductive member of the second LED board may be in electrically conductive contact with a corresponding one of the plurality of second electrically conductive pads, and a height of the LED lighting strip assembly, when each compressible electrically conductive member of the first LED board is pressed into electrically conductive contact with the corresponding one of the first electrically conductive pads and each compressible electrically conductive member of the second LED board is pressed into electrically conductive contact with the corresponding one of the second electrically conductive pads, may be substantially equal to about a sum of: a thickness of the third PCB substrate of the interconnect board, and the greater of the height of the first LED board and the height of the second LED board.

In some implementations, the compressible electrically conductive members may be pogo pins, and each electrically conductive pad of the plurality of first electrically conductive pads and the plurality of second electrically conductive pads may be at least larger in area than a cross-sectional area of a plunger of a corresponding pogo pin in the plane of the second side of the LED board in which the pogo pin is mounted.

In any of the foregoing implementations, each of the compressible electrically conductive members may extend at least about 0.9 mm from the second side of either the first LED board or the second LED board.

In any of the foregoing implementations, the assembly may further include at least one first hole located in the first region of the third PCB substrate of the interconnect board, at least one second hole located in the second region of the third PCB substrate of the interconnect board, at least one hole located in the first LED board and aligned with the at least one hole located in the first region of the third PCB substrate of the interconnect board, and at least one hole located in the second LED board and aligned with the at least one hole located in the second region of the third PCB substrate of the interconnect board.

In any of the foregoing implementations, the height of the LED lighting strip assembly may be less than about 5.5 mm.

In any of the foregoing implementations, each compressible electrically conductive member may be a spring-loaded pin.

In any of the foregoing implementations, a width of the end portion of the first LED board and a width of the end portion of the second LED board may be both be less than about 12 mm.

In any of the foregoing implementations, the LEDs in each plurality of LEDs may be spaced less than or equal to about 12 mm apart center-to-center.

In some implementations, a printed circuit board (PCB) interconnect assembly may be provided that includes a first board having a first PCB substrate with a first side and a second side opposite the first side of the first PCB substrate, and a plurality of compressible electrically conductive members that each extend outward from the second side of the first PCB substrate. The assembly may also include a second board having a second PCB substrate with a first side and a second side opposite the first side of the second PCB substrate, and a plurality of compressible electrically conductive members that each extend outward from the second side of the second PCB substrate. The assembly may further include an interconnect board that includes a third PCB substrate having a first region and a second region, the third PCB substrate including a plurality of first electrically conductive pads located on a first side of the third PCB substrate and within the first region of the third PCB substrate, and a plurality of second electrically conductive pads located on the first side of the third PCB substrate and within the second region of the third PCB substrate; each first electrically conductive pad may be electrically connected with at least one of the second electrically conductive pads by an electrically conductive trace of the interconnect board. In such implementations, each compressible electrically conductive member of the first board may be in electrically conductive contact with a corresponding one of the first electrically conductive pads, each compressible electrically conductive member of the second board may be in electrically conductive contact with a corresponding one of the plurality of second electrically conductive pads, and a height of the PCB interconnect assembly is, when each compressible electrically conductive member of the first board is pressed into electrically conductive contact with the corresponding one of the first electrically conductive pads and each compressible electrically conductive member of the second board is pressed into electrically conductive contact with the corresponding one of the second electrically conductive pads, substantially equal to about a sum of: a thickness of the third PCB substrate of the interconnect board, and the greater of the height of the first LED board and the height of the second LED board.

In some such implementations, the compressible electrically conductive members may be pogo pins, and each electrically conductive pad of the plurality of first electrically conductive pads and the plurality of second electrically conductive pads may be at least larger in area than a cross-sectional area of a plunger of a corresponding pogo pin in the plane of the second side of the board in which the pogo pin is mounted.

In any of the foregoing implementations, each of the compressible electrically conductive members may extend at least about 0.9 mm from the second side of either the first board or the second board.

In any of the foregoing implementations, the assembly may further include at least one first hole located in the first region of the third PCB substrate of the interconnect board, at least one second hole located in the second region of the third PCB substrate of the interconnect board, at least one hole located in the first board and aligned with the at least one hole located in the first region of the third PCB substrate of the interconnect board, and at least one hole located in the second board and aligned with the at least one hole located in the second region of the third PCB substrate of the interconnect board.

In any of the foregoing implementations, the height of the PCB interconnect assembly may be less than about 5.5 mm.

In any of the foregoing implementations, each compressible electrically conductive member may be a spring-loaded pin.

In any of the foregoing implementations, a width of the first board and a width of the second board may both be less than about 12 mm.

In some implementations, a method of assembling an LED lighting strip assembly is provided. The method may include placing an interconnect board having a first printed circuit board (PCB) substrate onto a supporting structure; the first PCB substrate may have a first electrically conductive pads located on a first side of the first PCB substrate within a first region of the first PCB substrate and a second electrically conductive pads located on the first side of the first PCB substrate within a second region of the first PCB substrate, and the first electrically conductive pad may be electrically connected with the second electrically conductive pad by an electrically conductive trace of the interconnect board. The method may further include placing a first LED board having a second PCB substrate with one or more LEDs located on a first side thereof such that a second side of the second PCB substrate opposite the first side of the second PCB substrate is proximate to the first side of the first PCB substrate of the interconnect board and such that a first compressible electrically conductive member extending outward from the second side of the first LED board is in electrically conductive contact with the first electrically conductive pad, placing a second LED board having a third PCB substrate with one or more LEDs located on a first side thereof such that a second side of the third PCB substrate opposite the first side of the third PCB substrate is proximate to the first side of the first PCB substrate and such that a second compressible electrically conductive member extending outward from the second side of the second LED board is in electrically conductive contact with the second electrically conductive pad, and applying one or more compressive forces to the first LED board and the second LED board to mechanically couple the first LED board and the second LED board to at least one of the interconnect board or a support structure.

In some implementations of the method, the first compressible electrically conductive member and second compressible electrically conductive member are pogo pins, and each electrically conductive pad of the first electrically conductive pad and the second electrically conductive pad are at least larger in area than a cross-sectional area of a plunger of a corresponding pogo pin in the plane of the second side of the LED board in which the pogo pin is mounted.

In any of the foregoing implementations of the method, the first compressible electrically conductive member and the second compressible electrically conductive member extend at least about 0.9 mm from the second side of either the first LED board or the second LED board. In any of the foregoing implementations of the method, the one or more LEDs of the first LED board and the one or more LEDs of the second LED board are spaced less than or equal to about 12 mm apart center-to-center. In any of the foregoing implementations of the method, a height of the LED lighting strip assembly may be, when the first compressible electrically conductive member of the first LED board is in electrically conductive contact with the first electrically conductive pad and the second compressible electrically conductive member of the second LED board is in electrically conductive contact with the second electrically conductive pad, substantially equal to about a sum of: a thickness of the first PCB substrate of the interconnect board, and the greater of the height of the first LED board and the height of the second LED board.

It should be appreciated that all combinations of the foregoing concepts and additional concepts discussed in greater detail below (provided such concepts are not mutually inconsistent) are contemplated as being part of the subject matter disclosed herein and/or may be combined to achieve the particular benefits of a particular aspect. In particular, all combinations of claimed subject matter appearing at the end of this disclosure are contemplated as being part of the subject matter disclosed herein.

These and other features of the disclosed embodiments will be described in detail below with reference to the associated drawings.

BRIEF DESCRIPTION OF DRAWINGS

The various implementations disclosed herein are illustrated by way of example, and not by way of limitation, in the figures of the accompanying drawings, in which like reference numerals refer to similar elements.

FIGS. 1 through 7 and 9 are to-scale within each Figure, although the scale may vary Figure to Figure.

DETAILED DESCRIPTION

Figure 1:
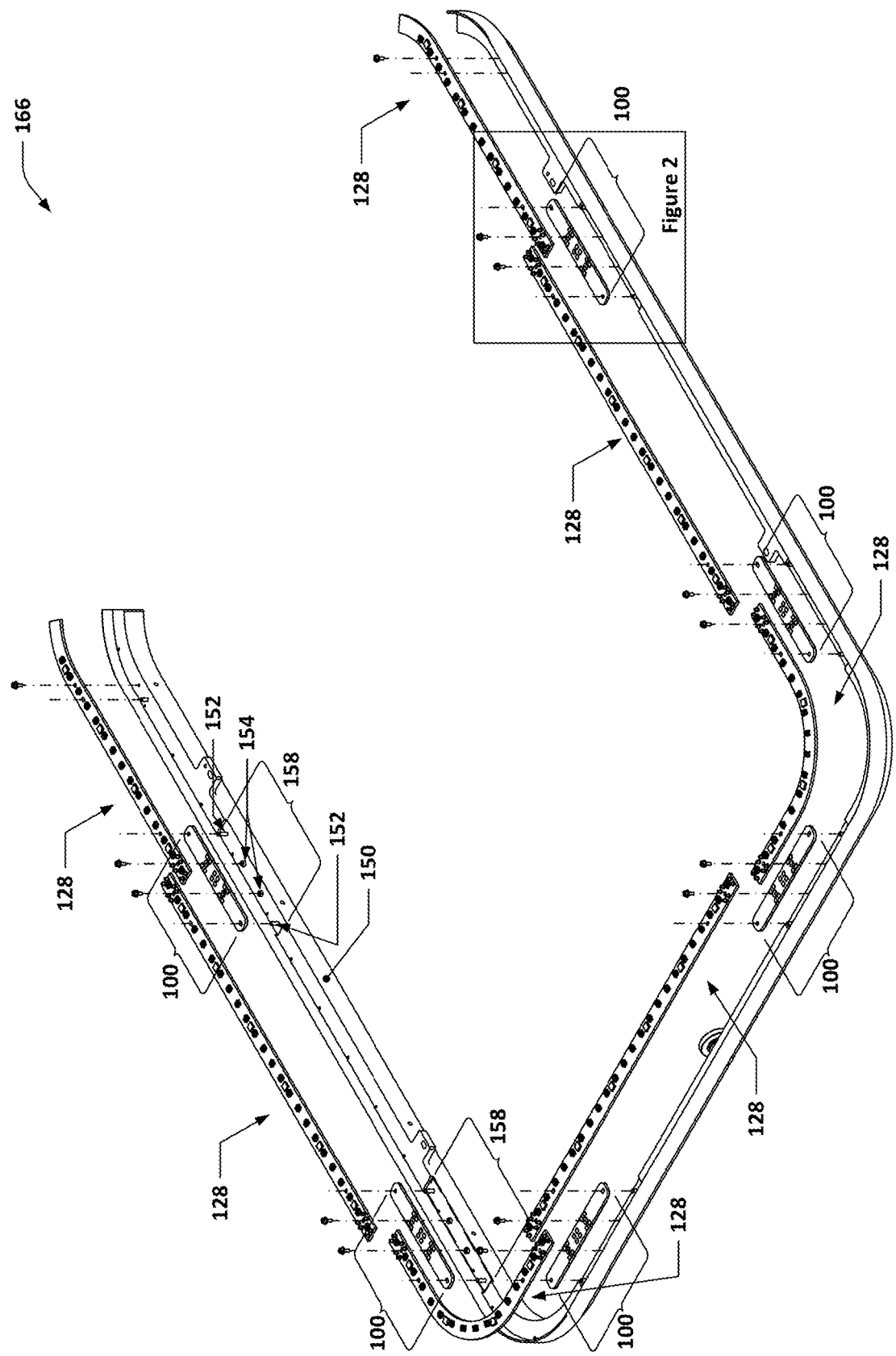
FIG. 1 presents an exploded view of part of an illuminable assembly as described herein.

In the following description, numerous specific details are set forth to provide a thorough understanding of the presented embodiments. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments.

This disclosure relates to a light bar interconnect scheme. Multiple straight or curved, long, narrow rigid printed circuit boards with linear arrays of LEDs (referred to below as "LED boards") on them may be used as part of an illuminable assembly and electrically connected to each other end-to-end. Such LED boards may be used to provide edge lighting, e.g., of a surface adjacent and perpendicular to the LED boards, or of a translucent light diffusion element.

To improve the visual aesthetic and uniformity of the illumination provided by the LEDs, all of the LEDs may be coplanar. The LED board assembly may also have a low profile, e.g., less than 7 mm, or less than about 5.5 mm, total height in a direction perpendicular to the board and less than 11 mm total width along one dimension. Such a small profile LED board assembly may be beneficial for usage in thin or low profile illumination assemblies to reduce the space claim of the assembly and/or reduce the appearance of a frame/seam of the illumination assembly. Such LED board assemblies may be manufactured as a single, contiguous PCB, but the cost of doing so may be uneconomical for larger-sized LED boards that follow convoluted paths, e.g., a U-shaped PCB strip that is 2 feet on a side and has a width of 1 cm might use a 2 foot square sheet of PCB material in order to be fabricated as a single piece-99% of this material may, in some cases, be cut away to provide the finished part.

An LED board assembly may thus be composed of smaller PCB boards that may be joined end-to-end to provide the desired end PCB layout. This allows for more efficient manufacturing, easier repairs, and more compact shipping.

Various commercial-off-the-shelf (COTS) connectors and other connection schemes were considered for the inter-LED board connections, but none of them provided the preferred tolerance allowances, current capacity, compactness, and ease-of-assembly desired. A new interconnect between each pair of adjacent LED boards was designed to satisfy these aspects.

Various implementations of an interconnect assembly for LED lighting strips are discussed herein. Each assembly includes an interconnect and two LED boards. The interconnect includes a single interconnect board, i.e., a printed circuit board, that fits underneath adjacent LED boards, i.e., on the side of the LED boards opposite the side where the LEDs are mounted, and provides electrical connection therebetween by way of exposed electrical contact pads that face towards the LED boards. The interconnect also uses a plurality of compressible electrically conductive members, e.g., spring-loaded pins or spring connectors, to connect the LED boards with the electrical contact pads of the interconnect board. In some implementations, the spring-loaded pins are sized so as to not interfere with the light emitted from the LEDs and to fit within the desired vertical height profile. The LED boards and the interconnect board may be fastened using aligned holes in each board, such that a fastener can be used to couple the LED board and interconnect board to a supporting structure, e.g., a housing, frame or other rigid component. Furthermore, the interconnect can be designed to carry large currents, i.e. greater than 4 amps, through providing multiple compressible electrically conductive members that are electrically connected with one another within the LED board and corresponding electrical contact pads that are electrically connected with one another within the interconnect board.

Such interconnect assemblies provide improved ease of manufacture and assembly, as well as replacement of parts, since the interconnects may be established through simply stacking the LED boards on top of the interconnect board. Such interconnects may allow for minimal LED spacing, i.e. on the order of 12 mm center-to-center spacing or less, without causing any lighting pattern non-uniformities. The interconnect may also handle misalignments in the x, y, and theta-z direction between the boards without sacrificing performance.

FIG. 1 presents an exploded view of an example interconnected LED board assembly 166 having multiple interconnect assemblies 100 according to some implementations. As discussed earlier, multiple LED boards 128 may be used as part of an illuminable assembly where it would be impractical to manufacture a single PCB board for the entire illuminable assembly. In such instances, an interconnect assembly 100 may be used to connect two adjacent, smaller-sized LED boards 128 using an interconnect board 102. The interconnect assembly 100 may be fastened to a supporting structure 150. Fastening the interconnect assembly 100 to the supporting structure 150 may be beneficial for providing a defined structure or pattern for the interconnect assembly 100, which may be rigid, semi-rigid, or flexible. If there are three or more LED boards 128 to connect, multiple interconnect assemblies 100 may be used. Generally, if there are N number of LED boards to be connected together in a chain, N−1 interconnect assemblies may be used, each interconnect assembly 100 successively connecting adjacent LED boards 128. Each interconnect assembly 100 includes two adjacent LED boards 128 and an interconnect board 102. For example, FIG. 1 shows seven LED boards 128 and six interconnect boards 102 that form six interconnect assemblies 100.

Figure 2:
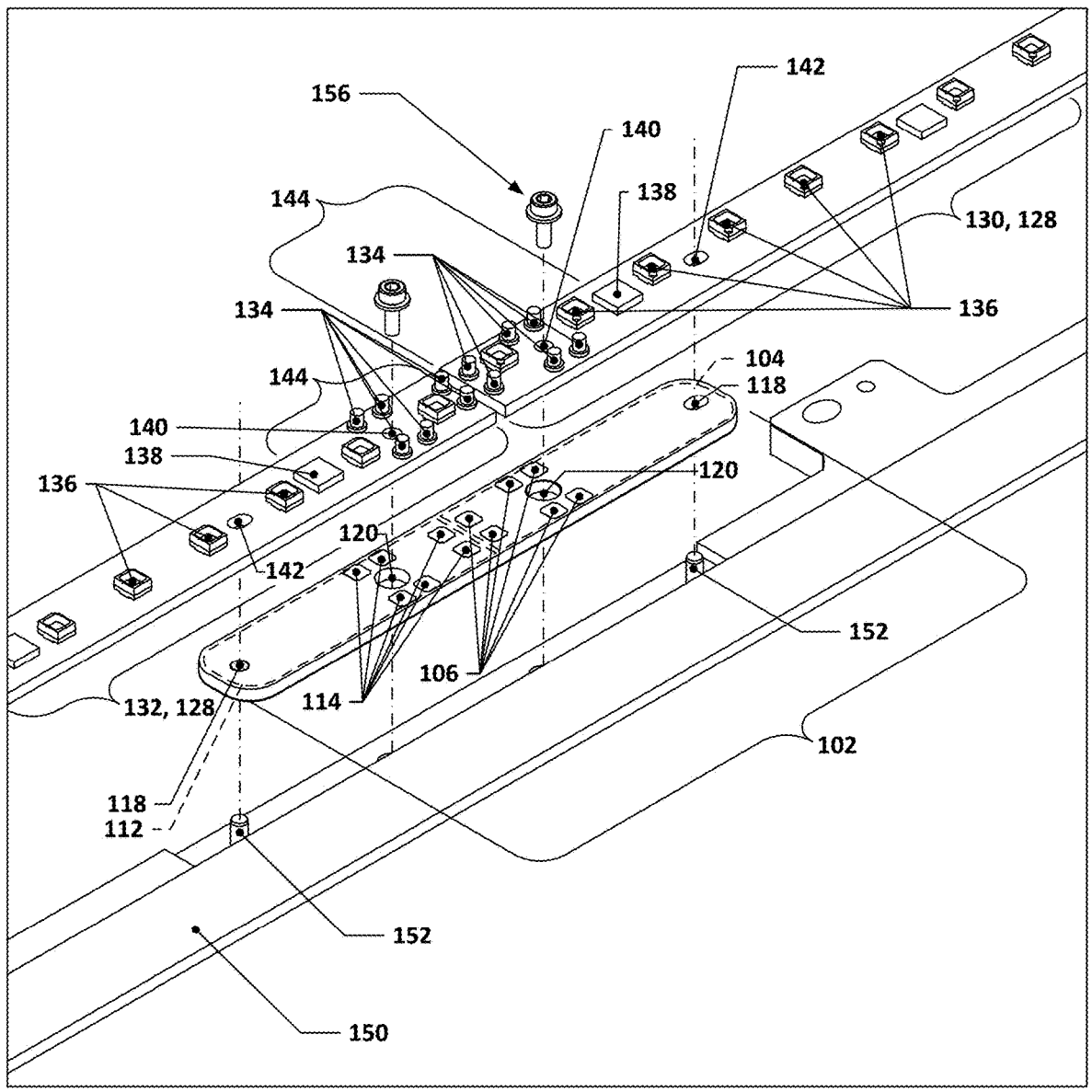
FIG. 2 presents an exploded view of an interconnect assembly as described herein.

FIG. 2 presents a close-up, exploded view of an interconnect assembly 100. The interconnect assembly 100 may include an interconnect board 102, a first LED board 130 of the LED boards 128, and a second LED board 132 of the LED boards 128. In some implementations, an LED board 128 that is the first LED board 130 of one interconnect assembly may be the first LED board 130 or the second LED board 132 of a different interconnect assembly 100, and vice-versa. The denomination of an LED board 128 as a first LED board 130 or a second LED board 132 is only for the purpose of clarity in this description.

The first LED board 130 and the second LED board 132 each may have one and/or a plurality of LEDs 136 laid out along their length that may be electrically connected to each other or to an integrated circuit LED driver 138. In some embodiments the LEDs 136 may have a spacing of about 12 mm center-to-center. In some implementations, due to the design of the interconnect, the same center-to-center spacing may persist across the junctions between LED boards 128. In such implementations, for example, an LED 136 on the first LED board 130 may be 12 mm center-to-center from the closest LED 136 on the second LED board 132. This may be desirable to provide a uniform light distribution to an outside observer.

The first LED board 130 and the second LED board 132 each may also have one or more LED drivers 138. In some implementations, the LED drivers 138 may be omitted or located remote from the LED boards. Each LED driver 138 may be electrically connected with and used to control at least one LED 136. In some implementations, each LED driver 138 may control four LEDs 136. In other implementations, each LED driver 138 may control one LED 136, two LEDs 136, three LEDs 136, or more than four LEDs 136. The LED driver 138 may be placed on the LED board 128 at a position closest to the LEDs 136 it controls. In some implementations, if an LED driver 138 controls four successive LEDs 136 along the LED board 128, it may be placed between the LEDs 136 such that two of the LEDs 136 it controls are on either side of the LED driver 138. The placement of the LED drivers 138 may be selected so to not interfere with the spacing and light emission of the LEDs 136.

In implementations where the LEDs 136 and LED drivers 138 are positioned as described above, the LED boards 128 may have limited space for other components or features, such as compressible electrically conductive members or holes. In some implementations, this constrains an interconnect assembly between the first LED board 130 and the second LED board 132. For example, in implementations where the LEDs 136 may be placed about 12 mm center-to-center, and the LED drivers 138 may be placed between every fourth and fifth LED 136, there may be limited space on the LED boards 128 for compressible electrically conductive members to connect the LED boards 128 and holes for fastening the LED boards 128 to a supporting structure.

One or more spring connectors 134 may be placed at the end portions 144 of the first LED board 130 and second LED board 132. Spring connectors 134, or compressible electrically conductive members, are electrical connectors that are electrically connected with the LEDs 136 and/or LED drivers 138, and which may provide for a spring-loaded electrical connection that includes an electrical contact that may be movable along a direction generally normal to the plane of the LED board 128; the movable portion of the electrical connectors may be biased, e.g., with a spring or other resiliently deformable component, to cause the movable portion or a resiliently deformable component itself to be urged towards, for example, the interconnect board 102. Although the present implementation is described in reference to LEDs 136 and/or LED drivers 138 for the LED boards 128, such components may be omitted and/or other components may be implemented instead, such as transducers, acoustic elements, etc. In some implementations, spring connectors 134 may be pogo pins, which are, as the name suggests, electrical contacts with a spring-loaded plunger that is able to translate along an axis that is perpendicular to the PCB in which such electrical contacts are mounted. Spring connectors 134 generally operate to electrically connect with first conductive pads 106 or second conductive pads 114 on the interconnect board 102.

Spring connectors 134 connect with the conductive pads 106, 114 by a mechanical force that urges the moveable portion of the spring connectors 134 to the contact the conductive pad 106, 114. In some implementations, spring connectors 134 are advantageous because a spring or other resiliently deformable component permits a misalignment between the interconnect board 102 and one of the LED boards 128 while still maintaining an electrical connection therebetween. In some implementations, such misalignments may include inexact spacing between the conductive pads of adjacent LED boards (x direction misalignment; such as may be caused by variation in the gap between the adjacent ends of two LED boards), inexact alignment between the longitudinal center lines of adjacent LED boards that may still be parallel (y direction misalignment; such as may be caused by transverse offsets between the ends of two LED boards), and inexact alignment between the longitudinal center lines of adjacent LED boards, such that they are not parallel, i.e. angled with respect to each other (theta-z misalignment).

The spring connectors and conductive pads may be sized to allow for the misalignments noted above while maintaining an electrical connection. For example, in some implementations, the conductive pads may be sized such that, under any worst-case tolerance stack-up conditions for the interconnect assembly, a centerline of a corresponding spring connector for each conductive pad may be at least 0.25 mm from the edge of the corresponding conductive pad, thereby creating a potential 0.5 mm diameter contact area (spring connectors, such as pogo pins, may often have a hemispherical or domed tip, resulting in a theoretical "zero" area contact (assuming the tip is a perfect hemisphere and the conductive pad a perfect plane), although various factors such as imperfect machining, material deformation, etc. typically result in a larger contact area than zero or such a larger contact area may be intentional for conductivity purposes). By sizing the conductive pads to be 2.5 mm on a side, up to 2 mm of misalignment can be tolerated between adjacent LED boards. It will be understood that other dimensional values may be used instead, depending on the misalignment tolerances desired, and the above example is merely provided as one possible scenario. In some implementations, the conductive pads may be sized so as inscribe a circle that is at least 2.75 times larger in diameter than, e.g., 2.75 to 4 times larger than, for example, the diameter of the plunger of a pogo pin or other spring connector that is used.

In some implementations, an interconnect assembly 100 is tolerant of various degrees of misalignment. In some implementations, the interconnect assembly 100 may tolerate a misalignment in an x- and/or y-dimension of less than +−0.5 mm, +−0.4 mm, +−0.3 mm, +−0.2 mm, and/or less than +−0.1 mm. In some implementations, the interconnect assembly 100 may tolerate a misalignment in a theta-z dimension of less than 0.1 mm, and/or less than 0.2 mm.

In some implementations, a spring connector 134 may extend from the surface of the LED board 128 facing the interconnect board 102 at least about 0.9 mm. If the interconnect board 102 and the LED board 128 are misaligned so as to cause a space no more than 0.2 mm between them at any given position between the two boards (which may occur due to rotation of one board with respect to the other or loosening of a fastener coupling them together in addition to the above misalignments), a spring connector 134 may still maintain electrical contact with its respective conductive pad 106, 114 on the interconnect board 102. The spring connectors 134 thus increase the tolerances of the interconnect assembly 100 and permits increased tolerances for manufacturing the various components of the interconnect assembly 100.

In the implementation described herein, the LED boards 128 are connected via an interconnect board 102, which has conductive pads 106, 114 that connect with the spring connectors 134 of the first LED board 130 and the second LED board 132. In some implementations, the interconnect board 102 includes a first region 104 and a second region 112, where the first region 104 has a first plurality of conductive pads 106 and the second region 112 has a second plurality of conductive pads 114. Each conductive pad of the first plurality of conductive pads 106 connects with a corresponding one of the spring connectors 134 of the first LED board 130. Likewise, each conductive pad of the second plurality of conductive pads 114 connects with a corresponding one of the spring connectors 134 of the second LED board 132.

Figure 3:
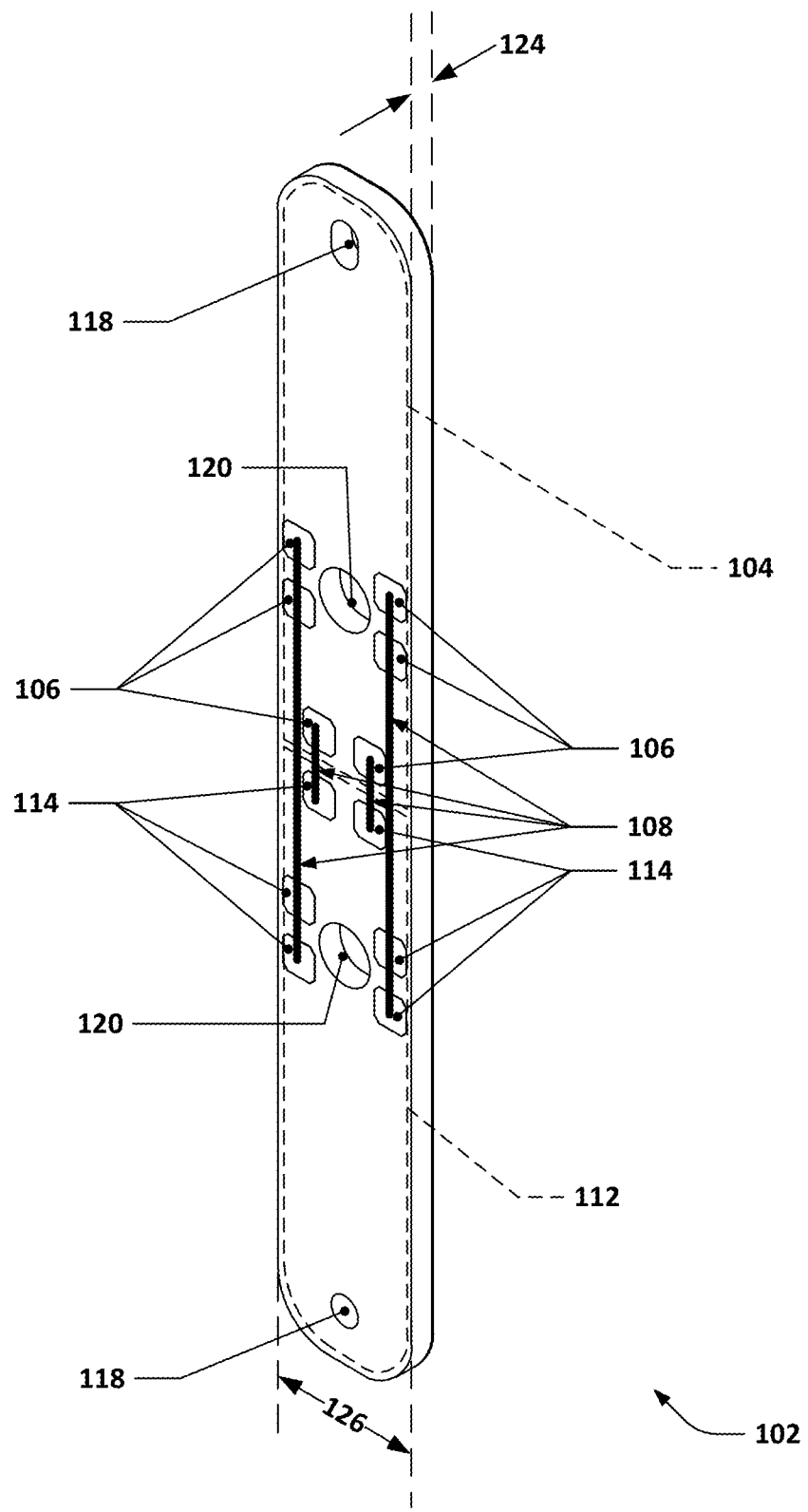
FIG. 3 presents a view of an interconnect board used in an interconnect assembly as described herein.

Each conductive pad of the first plurality of conductive pads 106 is electrically connected via a conductive trace of the interconnect board 102 with at least one of the conductive pads of the second plurality of conductive pads 114. In other implementations, the first plurality of conductive pads 106 and the second plurality of conductive pads 114 may be a single contiguous conductive pad or other electrically conductive configuration that may be beneficial to conduct electricity from one part of the interconnect board 102 to another part of the interconnect board 102. FIG. 3 presents a view of an interconnect board 102 showing traces 108. In some implementations, two of the conductive pads of the first plurality of conductive pads 106 are connected with two of the conductive pads of the second plurality of conductive pads 114. This may be advantageous to increase the amperage that may be carried via the traces 108, conductive pads 106, 114, and spring connectors 134, which in some implementations may exceed 4 amps. For example, in some implementations the spring connectors 134 may not be rated to carry 4 amps, or are rated for at least 2 amps and less than 4 amps.

In such embodiments, using two or more spring connectors 134 in parallel may distribute the amperage, allowing for each spring connector 134 to carry less than 4 amps, reducing the potential for failure of any spring connector 134. The use of spring connectors in parallel in some implementations may also provide redundancy for the purpose of improved reliability. The traces between each conductive pad may have different sizes, shapes, or materials. In some implementations, traces that are intended to carry 4 amps (or larger amperages) will be thicker or wider than traces that will carry less than 4 amps. In some implementations traces that will carry large currents, e.g. more than 4 amps, may use copper planes on one or more layers of the PCB of the interconnect board.

In the implementation shown, the conductive pads and traces in the first region 104 and the second region 112 are symmetrical across a line of symmetry between the first region 104 and second region 112. However, it should be understood that in other implementations the pluralities of conductive pads 106, 114 and traces 108 may not be symmetrical. The conductive pads 106, 114 and traces 108 may be placed in any arrangement that allows the interconnect board 102 to electrically connect two LED boards 128 as described herein.

In some implementations the interconnect board 102 has a thickness 124 that is less than 1.6 mm. This may be advantageous to minimize the total thickness of the interconnect assembly 100. In some implementations the interconnect board 102 has a width 126 less than 10.5 mm. This may be advantageous to allow the interconnect board to fit within an illuminable assembly as described herein.

Returning to FIG. 2, in some implementations each of the conductive pads 106, 114 is sized to allow for easy connection with spring connectors 134 of the first and second LED boards 130, 132. The conductive pads 106, 114 are shown as roughly square in FIG. 2, but may be rectangular, circular, pentagonal, or any other shape that facilitates an electrical connection with a spring connector 134 and allows for some amount of misalignment between the spring connectors 134 and the conductive pads 106, 114. In some implementations, the conductive pads 106, 114 may have a diameter (or equivalent, perpendicular dimensions) of at least 2.5 mm. This may allow the conductive pads 106, 114 to maintain electrical connection with the spring connectors 134 of the LED boards 128 without precise positioning.

In some implementations, the conductive pads 106, 114 are sized based on a tolerance range for manufacturing and positioning the interconnect board 102 and the LED boards 128, so that the LED boards 128 and the interconnect board 102 can maintain an electrical connection between each conductive pad 106, 114 and a corresponding spring connector 134 within the tolerance range. In some embodiments, this tolerance range may be less than about 1 mm misalignment between the interconnect board 102 and either of the first LED board 130 or the second LED board 132 in a direction parallel to the surface of the interconnect board 102. In some embodiments, a tip of a spring connector that contacts a conductive pad may have a contact area having diameter of about 0.5 mm. In such embodiments, a central point of contact of a spring connector 134 may be off-center from the center of its respective conductive pad 106, 114 by up to about 1 mm and still have the entire contact area of the tip of the spring connector in contact with the conductive pad 106, 114. In some embodiments, the diameter (or equivalent perpendicular dimensions) may be at least about 5 times larger, at least about 4 times larger, at least about 3 times larger, or at least about 2 times larger than the diameter of the contact area of the spring connector 134. For example, if the spring connectors 134 have a contact area diameter of about 0.5 mm, the conductive pads 106, 114 may have a diameter of at least 2.5 mm, 2.0 mm, 1.5 mm, or 1.0 mm.

In some implementations the interconnect board 102 has at least one fastener hole 120. In some implementations, a fastener hole 120 may be sized to fit around a boss 154 (not visible in FIG. 2) that protrudes from a supporting structure 150 to which the interconnect board 102 may be fastened. In some implementations, the fastener hole 120 may be sized smaller than the boss 154, so that the interconnect board 102 rests on top of the boss 154 (or, alternatively, the threaded hole for the fastener may simply be provided in a feature without using a boss 154). In some implementations there may be a fastening hole 120 in the first region 104 and in the second region 112, while in other implementations there may be only one single fastening hole 120, located in either region 104, 112. In some implementations there may be no fastening holes 120. In such implementations, the interconnect board 102 may be fastened to a supporting structure 150 by a different mechanism, such as a clamp that that fits over the LED boards and/or the interconnect board 102, or by an adhesive.

In some implementations the interconnect board 102 has at least one positioning hole 118. A positioning hole 118 may be smaller than a fastening hole 120, and may be used to fit around a peg 152 that protrudes from a support structure 150. The positioning hole 118 may be sized slightly larger than the peg 152 in order to easily fit around the peg 152 while minimizing the movement of the interconnect board 102 along a plane perpendicular to a central axis of the peg 152. In some implementations there may be a positioning hole 118 in the first region 104 and in the second region 112, while in other implementations there may be only one positioning hole 118, located in either region 104, 112. In some implementations there may be no positioning holes 118. In such implementations the interconnect board 102 may be properly positioned by a different mechanism, such as by recess 158, shown in FIG. 1, that the interconnect board 102 fits into, where the dimensions of recess 158 and the LED boards 128 positioned above the interconnect board 102 in the assembled interconnect assembly 100 inhibit the movement of the interconnect board 102. In some implementations, the interconnect board 102 is positioned by an adhesive.

Similar to the interconnect board 102, the first LED board 130 and the second LED board 132 may also each have at least one positioning hole 142 and/or at least one fastening hole 140. The positioning hole 142 of the first or second LED board may fit around a peg 152 and line up with a positioning hole 118 in the interconnect board 102. In some implementations positioning hole 142 may be a different shape, such as a slot, that has an opening larger than peg 152 and may therefore fit around peg 152 without restricting the movement of the interconnect board 102 in an x- and/or y-direction. While a fastener hole 120 in the interconnect board 102 may be sized slightly larger than a boss 154 of the supporting structure 150, a fastening hole 140 in either of the LED boards may be smaller than the fastener hole 120. However, in some implementations the fastener hole 120 may be the same size as a fastening hole 140, such that a boss 154 would not fit through either hole. Instead, the fastening holes 118, 140 may be sized to allow the body of a fastener 156 to pass therethrough while not allowing the head of the fastener 156 to pass through.

In some implementations, the positioning holes 142, fastening holes 140, positioning hole 118, and fastener hole 120 may be along a longitudinal center line of each of the LED boards and interconnect board. In other implementations, one or more of the holes may be off the longitudinal center line. Positioning the holes off-center may allow for easier assembly, as there may be only one correct orientation for positioning the LED boards and interconnect boards.

When the interconnect assembly 100 is assembled, the fastener 156 urges the LED boards 128 and the interconnect board 102 together, contacting the spring connectors 134 with the conductive pads 106, 114. Thus, an electrical circuit is formed between the spring connectors 134 of the first LED board 130 and the spring connectors 134 of the second LED board 132 via the first plurality of conductive pads 106, the second plurality of conductive pads 114, and the conductive traces 108 therebetween in the interconnect board 102. In some embodiments, if the LED boards 128 are misaligned, the spring connectors 134 may maintain an electrical connection due to the spring or other moveable portion extending from the spring connector 134 outwards, towards the interconnect board 102 and due to the oversized dimensions of the conductive pads 106, 114 on the interconnect board 102. As each spring connector 134 may be independently urged towards the interconnect board 102, a considerable amount of misalignment may be tolerated.

Returning to FIG. 1, the LED boards 128 may be used as part of a LED lighting strip assembly or interconnected LED board assembly 166 in an illuminable assembly that illuminates a larger apparatus. In some implementations, the illuminable interconnected LED board assembly 166 includes a supporting structure 150 that the LED boards 128 and interconnect boards 102 are fastened to as an interconnect assembly 100. The supporting structure 150 may have a recess 158 for each interconnect assembly 100 that is sized to fit an interconnect board 102. In some implementations each recess 158 has a depth about the same as the thickness 124 of the interconnect board 102, and a width and length at least the same as the width and length of the interconnect board 102. This may be advantageous to allow the LED boards 128 to be co-planar, as the interconnect board 102 does not extend out of the recess 158. As the LED boards 128 are co-planar, the LEDs 136 are co-planar, improving the uniformity of the visual effect from the LEDs 136. In some embodiments, the interconnect boards may sit on top of the supporting structure 150 with no recesses 158. While the present example is described in reference to LEDs 136 and LED boards 128, other electrical components and boards may be implemented using the interconnect board 102, such as acoustic components, MEMs, etc.

Additionally, each recess 158 may have at least one boss 154 and at least one peg 152. The pegs 152 may be used to position the interconnect board 102 and LED boards 128 and facilitate the interconnect assembly 100. The bosses 154 may provide additional depth for a fastener. In some embodiments, the depth of the supporting structure 150 below each recess 158 is insufficient for a fastener to properly catch and thus hold the interconnect assembly 100 together. A boss 154 may thus be used to permit a sufficient depth for a fastener, while also allowing the recess 158 to have a depth of about the thickness of the interconnect board 102.

The dimensions of the support structure 150 may restrain the possible dimensions of the LED lighting strip assembly 166. Thus, in some implementations, the LED boards 128 are a rigid PCB board having a width less than about 11 mm. Additionally, in some implementations the height of the interconnect assembly 100 is less than 7 mm. This may be to prevent the interconnect assembly from affecting the light from the LEDs 136, which may cause noticeable disruption in the light pattern from the LEDs 136 as seen by an observer. It may also allow for sufficient material in the supporting structure 150. As can be seen in FIG. 1, a recess 158 in the supporting structure 150 is sized to fit an interconnect board 102. A thicker interconnect arrangement may use a deeper recess/thinner supporting structure below the interconnect to maintain co-planarity of the LEDs 136. This may increase the chance of failure of the support structure 150 at the recess 158, increase the design complexity of the supporting structure 150, and/or decrease the supporting structure's 150 rigidity, all of which are undesirable.

Figure 4:
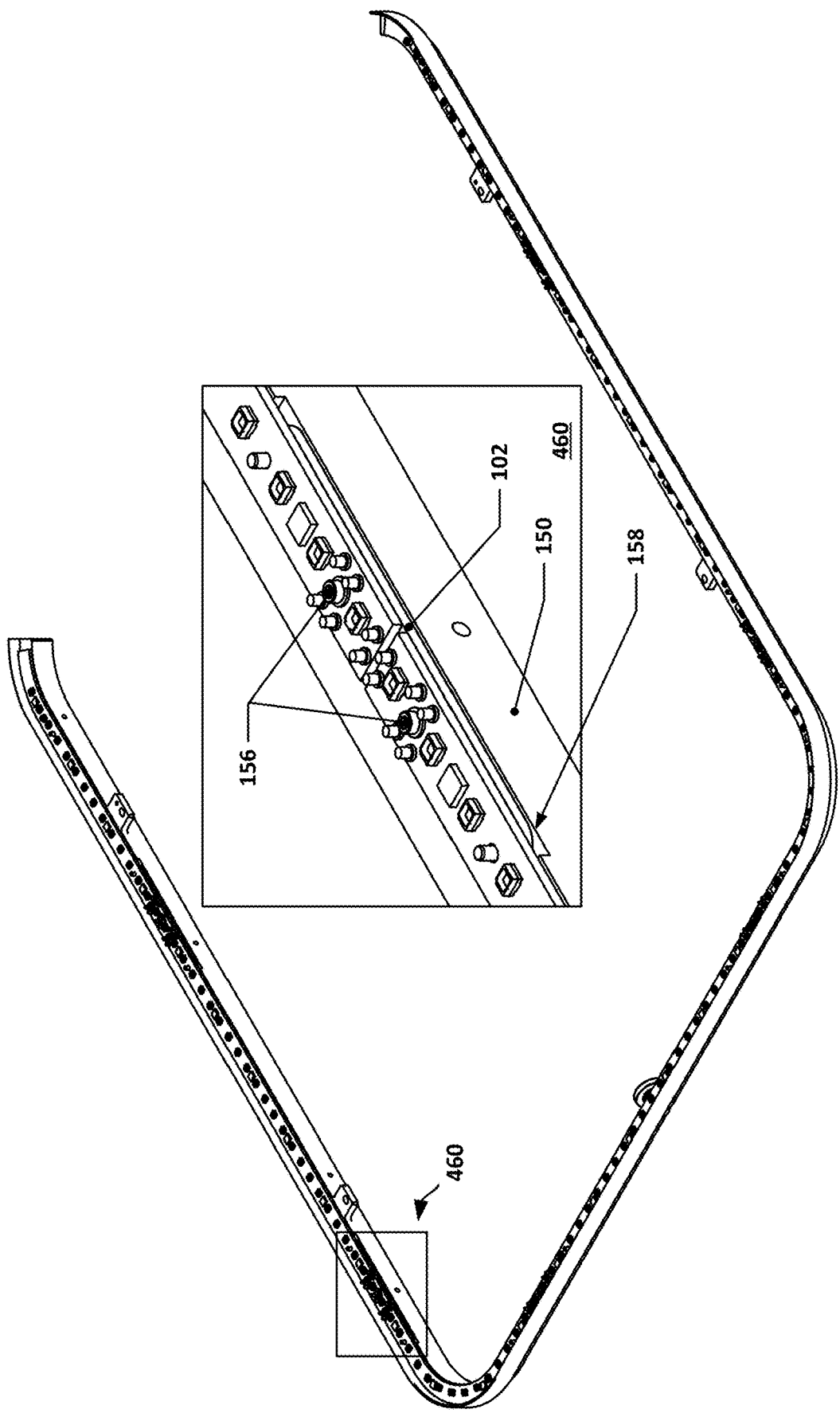
FIG. 4 presents an assembled view of part of an illuminable assembly as described herein.

FIG. 4 presents an assembled view of the interconnected LED board assembly 166 shown in FIG. 1. Specifically, inset view 460 presents a close-up view of an assembled interconnect assembly 100. Interconnect board 102 may be seen fitting into recess 158. Two fasteners 156 each fasten a corresponding LED board 128 to the interconnect board 102 and the supporting structure 150.

As noted above, in some implementations an interconnect assembly 100 has a total height that allows for a low profile total height, e.g., less than 7 mm, or less than about 5.5 mm, in a direction perpendicular to the board. In some implementations, the height of the assembled interconnect assembly 100 is substantially equal to a sum of the thickness 124 of the interconnect board 102, and the greater of a height of either the first LED board 130 or the second LED board 132. Substantially equal, in this context, may include allowing the height to be equal to this sum or equal to this sum plus an additional amount, e.g., less than 0.2 mm or less than 0.1 mm, to account for potential small gaps between the interconnect board 102 and either the first LED board 130 or the second LED board 132, e.g., gaps of less than 0.2 mm, less than 0.1 mm, or no gaps. The height of an LED board 128, as used herein, is a maximum normal distance between a bottom or second side of the LED board 128 and a topmost or uppermost surface of the components mounted to the first side of the LED board, such as a top surface of an LED 136, a top surface of an LED driver 138, an upper surface of a compressible electrically conductive member 134, etc. Notably, in some implementations the height of an LED board 128 does not include the distance a compressible electrically conductive member 134 extends from the bottom or second side of the LED board 128, as the compressible electrically conductive member 134 may, in some instances, be compressed into the LED board 128. As discussed further below in reference to FIG. 9, a compressible electrically conductive member 134 may be compressed when an interconnect assembly 100 is assembled, and may not extend from the bottom or second side an LED board 128 when compressed.

Figure 5:
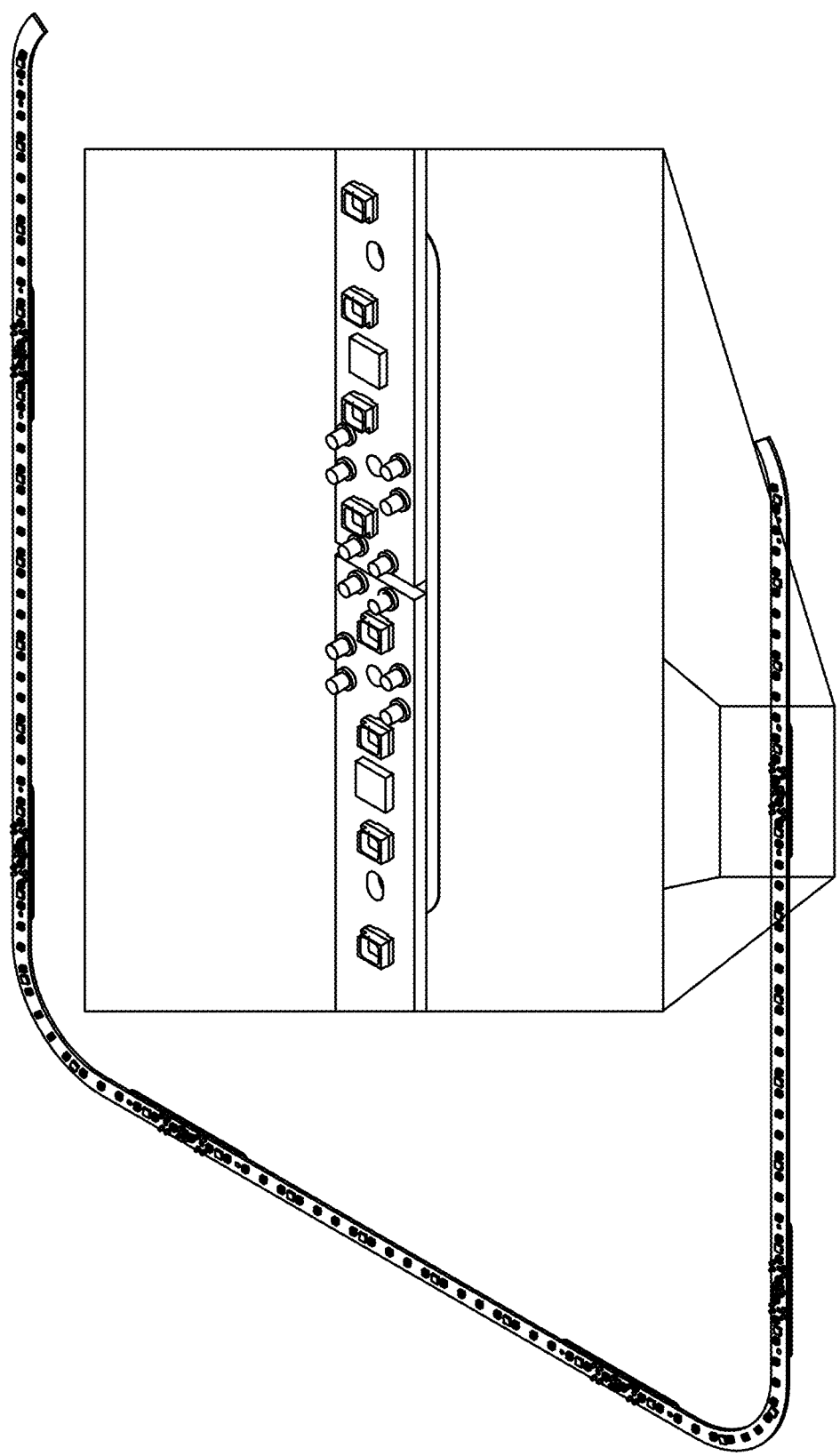
FIG. 5 presents an assembled view of interconnected LED boards.

FIG. 5 presents another view of an interconnected LED board assembly 166, this view lacking the supporting structure 150.

Figure 6:
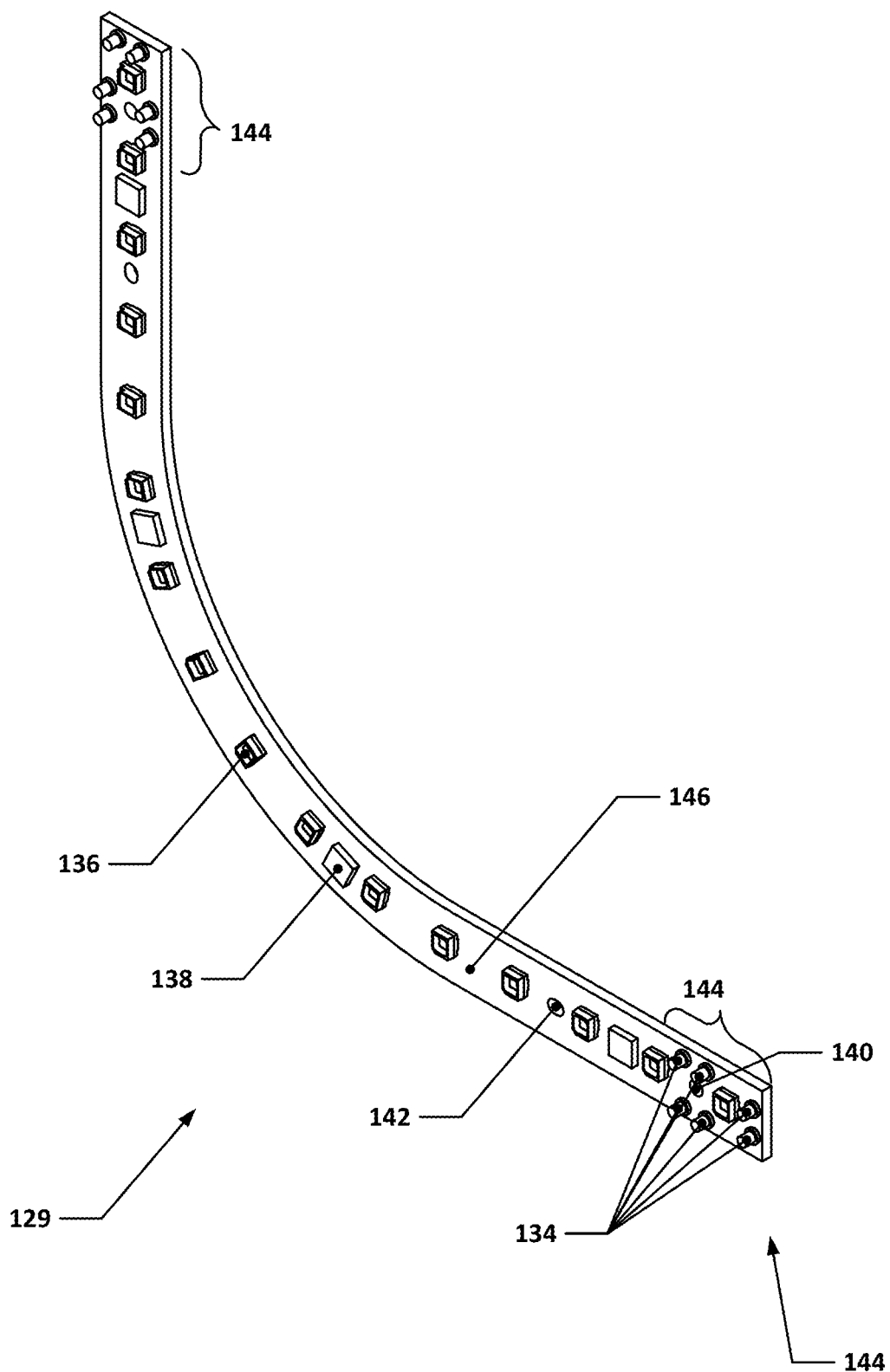
FIG. 6 presents a view of one side of a curved LED board.
Figure 7:
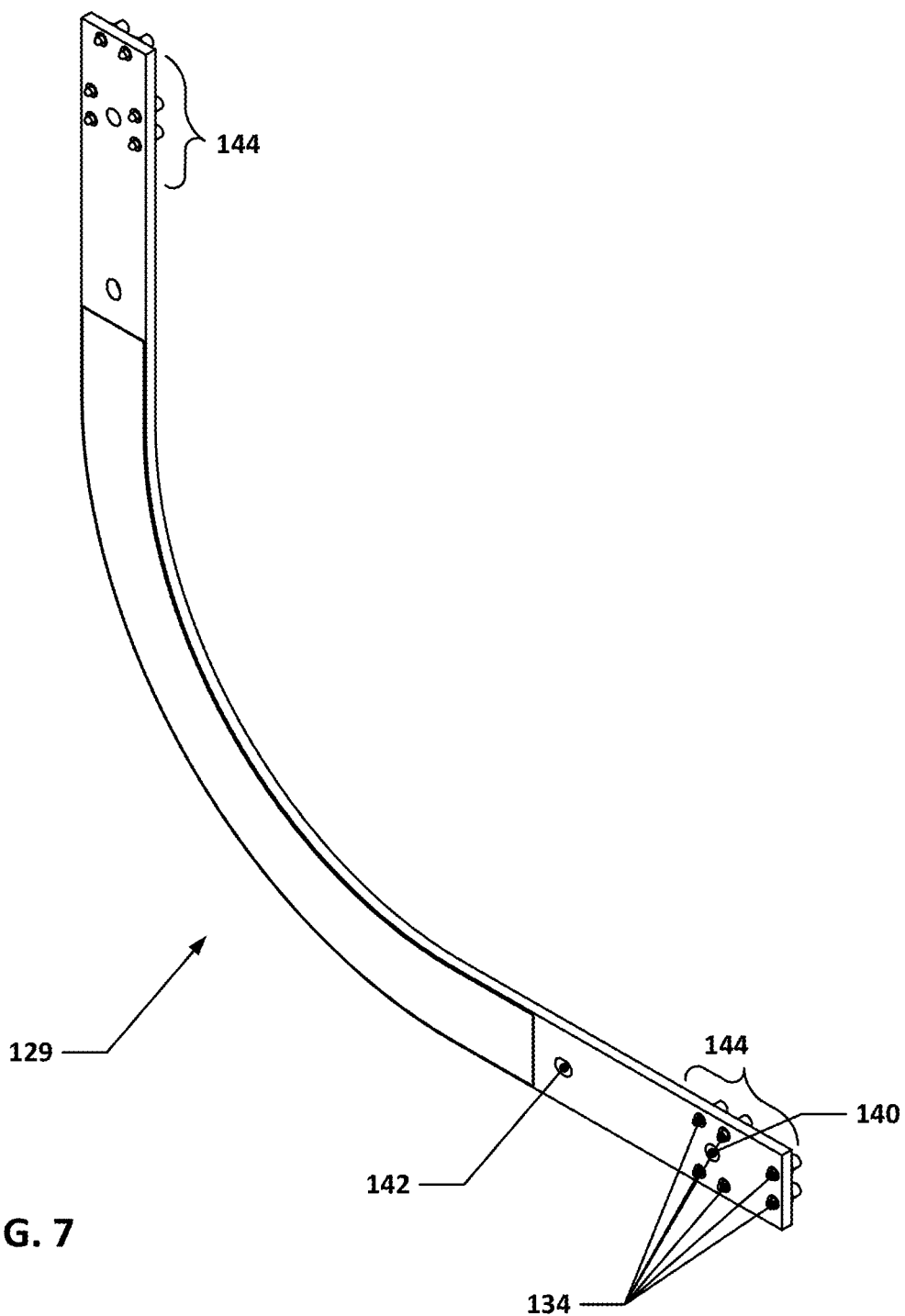
FIG. 7 presents a view of a different side of a curved LED board.

FIGS. 6 and 7 present a front and back view of a curved LED board 129. The curved LED board 129 includes a PCB 146 having one and/or a plurality of LEDs 136 and/or LED drivers 138 placed thereon. Curved LED board 129 also has spring connectors 134, a positioning hole 142, and a fastening hole 140 at both end portions 144.

Curved LED board 129 curves within the plane of the PCB board 146. The LEDs 136 may generally have a higher luminescence per energy spent when emitting light in a direction perpendicular to the plane of a surface on which they are mounted, compared to emitting light parallel to the plane of a surface on which they are mounted. Thus, by having the LED board 129 curve within the plane of the PCB board 146, the LEDs 136 may act more efficiently to achieve a similar amount of luminescence than if the LED board 129 curved out of the plane of the PCB board 146. If the LED board 129 curved out of the plane of the PCB board 146, such as by using a flexible circuit board, the LEDs 136 would have to emit light parallel to the surface on which they are mounted, which would result in increased energy to achieve a similar luminescence. Furthermore, if the LED board curved out of the plane of the PCB board, such as by using a flexible circuit board, the total height of the LED board in the direction of the axis of curvature may be greater than the height of an embodiment as shown where the LED board curves within the plane of the PCB board. Curved LED board 129 may also be straight at each end portion 144 to facilitate connection with an interconnect board 102. In some embodiments, both the end portion of the LED board 129 and the interconnect board 102 may be curved.

FIG. 7 presents a back view of a curved LED board 129. The positioning holes 142 and fastening holes 140 are still visible, as are plungers of the spring connectors 134, i.e., a portion of the compressible electrically conductive members. The back side of curved LED board 129 may not have any other features, and the end portions 144 may connect with an interconnect board 102 in order to electrically connect curved LED board 129 with another LED board 128, 129. In some embodiments, the spring connectors 134 may extend from the back of the curved LED board 129 by about 0.9 mm. Additionally, the spring connectors may extend from the front of the curved LED board 129 by less than about 2.2 mm, or about 2.15 mm.

Figure 8:
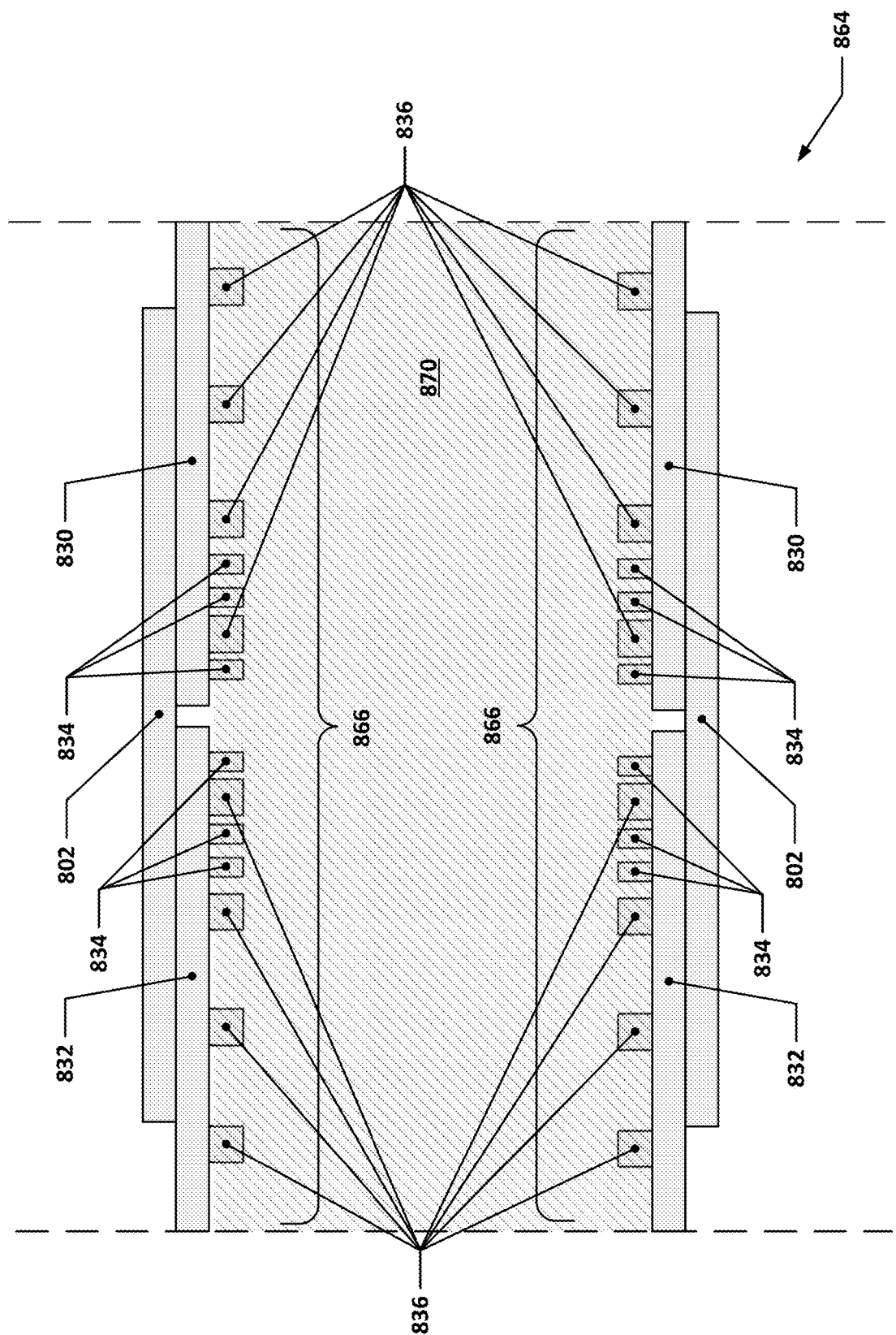
FIG. 8 presents a view of an illuminable assembly as described herein.

FIG. 8 is a partial view of an illuminable assembly 864 having two interconnected LED board assemblies 866 as described herein, each having a first LED board 830, a second LED board 832, and an interconnect board 802. The LED boards 830 and 832 may each have a plurality of LEDs 836 and a plurality of compressible electrically conductive members 834, as discussed above. Each of the interconnected LED board assemblies 166 may be within and hidden by the illuminable assembly 864. One interconnected LED board assembly 866 is on the bottom of illuminable assembly 864, having LEDs 836 that emit light upwards, while another interconnected LED board assembly is mounted on the top of illuminable assembly 864, having LEDs 836 positioned to emit light downwards. While only one interconnect assembly is shown for the top and bottom interconnected LED board assemblies 866, each interconnected LED board assembly 866 may have multiple interconnect assemblies, as described earlier. The light from each LED 836 may then be emitted into a light region 870 between the two interconnected LED board assemblies, which may, for example, be bounded by a diffuser panel or other light-spreading device to form an evenly illuminated wall or surface.

Figure 9:
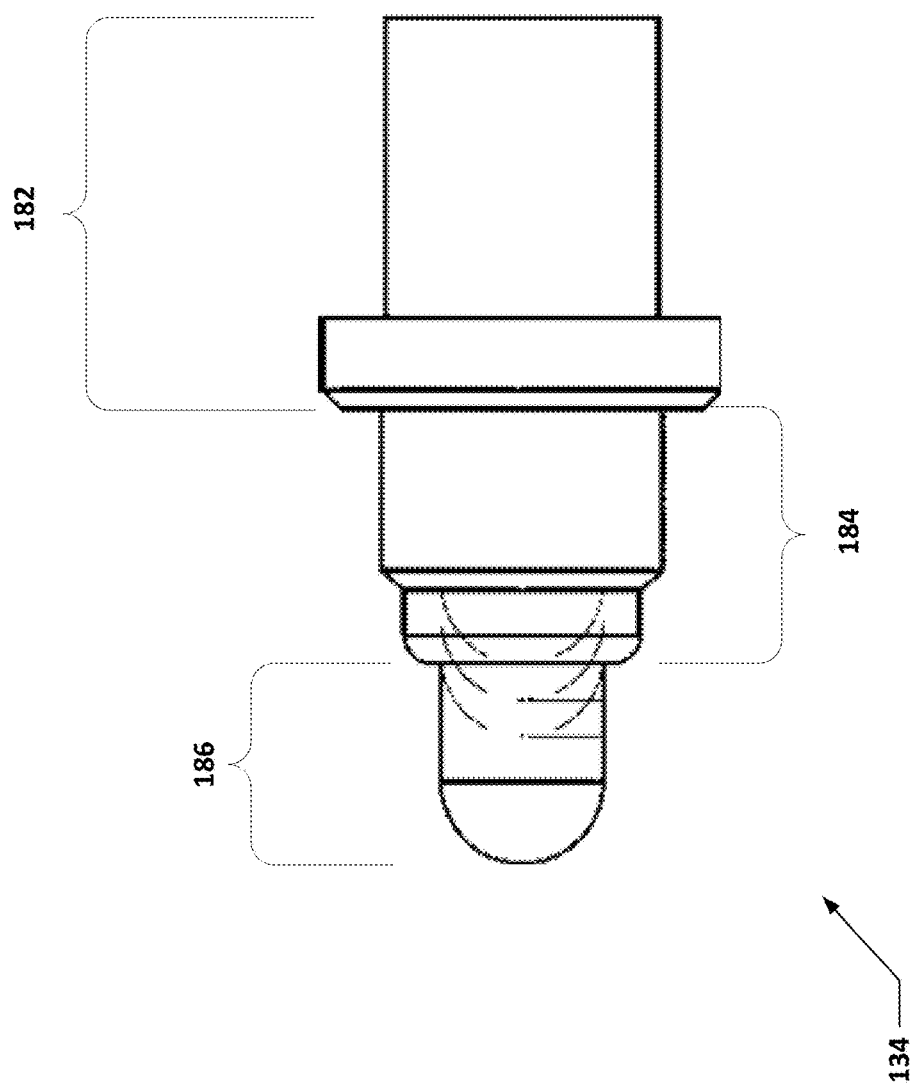
FIG. 9 presents a view of a compressible electrically conductive member.

FIG. 9 is a view of an example compressible electrically conductive member 134. A compressible electrically conductive member 134, or spring connector 134, may have three main parts: an internal body portion 184, a plunger 186, and an external body portion 182; an internal spring (not visible) is housed within the body portions 182, 184 and applies force to the plunger 186 to cause the plunger 186 to be urged out of the exposed end of the internal body portion 184. The internal body portion 184 may fit inside of a PCB when the compressible electrically conductive member 134 is installed in a hole in the PCB; this is in contrast to typical pogo pins, which have housings that often extend out from both sides of the PCB in which they are mounted (typical pogo pins are not designed to allow the pins to be fully compressed into the PCB). The internal body portion 184 therefore may have a length, as measured along a central axis normal to a circular cross section of the compressible electrically conductive member 134, less than about 1.44 mm, so that the internal body portion 184 is no longer than the thickness of a PCB it is configured to interface with.

Plunger 186 extends from the internal body portion 184, and is movable with respect to the internal body portion 184 along the central axis. As part of an interconnect assembly 100, the plunger 186 of each compressible electrically conductive member 134 is in electrically conductive contact with a conductive pad 106, 114 on an interconnect board 102, compressing the plunger 186 towards the internal body 184. In some implementations, plunger 186 may be the only part of the compressible electrically conductive member 134 that extends beyond the surface of the PCB on the side of an LED board 128 facing the interconnect board 102.

The external body portion 182, when installed in an LED board 128, may extend from the side of the PCB facing away from the interconnect board 102. The external body portion 182 has a flange that may limit the movement of the compressible electrically conductive member 134 through the PCB during installation, thereby ensuring that the compressible electrically conductive member 134 is installed at the appropriate height/depth relative to the PCB. The external body portion 182, inclusive of the flange, may have a length less than about 2.2 mm to avoid interfering with the light emitted from LEDs 136.

It will be understood that the interconnects shown herein may be particularly well-suited for making end-to-end connections between relatively thin, long PCBs, e.g., such as may be used for LED strip lighting. Such PCBs can be approximately 1 cm wide and an order or magnitude more larger in length. Some LED lighting applications use at least two conductive paths to be established across each such end-to-end connection; for LED lighting applications in which the color of the LEDs may be controlled, such connections may use at least four conductive paths to be established across each such end-to-end connection— power, ground, clock signal, and data signal. Establishing a robust, easy-to-assemble end-to-end connection between adjacent LED boards such as those discussed above may be problematic. In fact, several alternative options were considered, but the foregoing interconnect arrangement had preferable levels of performance.

For example, one alternative to the foregoing interconnect arrangement utilizes a butt-mounted, 90° pin connector, with a female connector located on an end of one board, and a male connector located on the adjacent end of another board. The male connector has a plurality of pins that protrude out from the end of the board along a longitudinal axis of the board (i.e., along the longest axis of the board at that end of the board); the female connector has a corresponding number of receptacles that would be positioned to receive those pins when the two boards are properly aligned with one another and slid towards each other along the longitudinal axis. However, several issues are presented with the use of such connectors. For example, if such connectors are used, it complicates assembly since the electrical connection between boards may need to be made before the boards are, for example, placed into position. Additionally, such connectors may use relatively precise positioning, which can be difficult to achieve with the tolerance stack-ups of the depicted structure. A similar variant is to have the male connector use spring-loaded pins that are oriented to translate in a direction parallel to the plane of the board and out from the end of the board; however, such connections were similarly found to be unable to meet the mechanical tolerance stack-up of the depicted structure of FIG. 1.

In contrast to the above butt-mounted pin connectors, the above-described implementations advantageously provide for easier assembly. In the example structure of FIG. 1, the boards can be placed into position over locator pins that are perpendicular to the planes of the boards—once placed, the pins can prevent the boards from moving laterally and/or longitudinally. The above described interconnect assembly may be beneficial as the assembly is easier to assemble by simply stacking the boards onto the pins, the assembly does not require assembly prior to placement, and the assembly allows for x- and y-direction misalignment, such as from manufacturing tolerances. Additionally, implementations as described above allow a suitably small distance between the LEDs on two adjacent boards while also carrying sufficient current for the LED circuit.

Another alternative is an open-ended cartridge edge connector. Such connectors are H-shaped in cross-section, and are designed to receive the edges of PCBs in both the top and bottom notches of the H-shaped cross-section. The edges of the PCBs used in such an interconnect would have exposed conductive pads which the cartridge end connector would connector together electrically through the use of conductive elements within the connector. In testing, such connectors were found to be too large in size, i.e., it was not possible to have LEDs that were adjacent to the cartridge edge connectors that were sufficiently close together to meet, for example, ~12 mm center-to-center spacing of the LEDs along the PCBs and across the end-to-end connection. The above-described implementations, by contrast, allow for closer spacing because the spring connectors may be placed so as to not obstruct the end portions of each LED board, allowing for LEDs to be placed closer to the end of each LED board.

In addition, some solutions using custom-made hardware were considered. For example, another option that was considered was end-to-end soldered wire connections between adjacent boards, but such connections may be difficult to manufacture, delicate, and may complicate assembly since the boards may need to be connected together prior to assembly, and may make disassembly difficult in the event that one LED board is found to have a manufacturing defect and/or otherwise is to be replaced. The above-described implementations advantageously do not require such delicate assembly, and may instead by assembled by stacking the boards, such as onto pegs and fastening them to maintain the electrical connection.

Yet another option that was considered was to create individual, small conductive clamps with upper and lower jaws that could be placed on either side of two adjacent PCBs such that each clamp contacted exposed conductive contact pads positioned along the edges of each end-to-end edge of the PCBs; the clamps could then be individually tightened using a screw that passed through one jaw and into a threaded hole on the other jaw. This solution, however, may utilize conductive path connections that use three parts (two jaws and a screw), utilize components that may be tiny and hard to handle, and utilize screws that may loosen, which can make the connection unreliable. The above-described implementations may avoid such aspects by using conductive pads with an area larger than the contact area on a spring connector, which may maintain an electrical connection despite misalignments between the boards and may not require handling of small parts during assembly.

The interconnect scheme discussed throughout this application provided the most reliable interconnect solution that still provided the desired degree of closeness in inter-LED spacing across the interconnect region, low overall profile, current-carrying rating, and board misalignment tolerance.

It will be appreciated that the various features discussed herein may also, in some implementations, be implemented in a scaled-down (or scaled-up) format. For example, if lower-output LEDs are used and/or a lower number of LEDs is used, the current level that may need to be supported may be lower, and smaller and/or fewer compressible electrically conductive members may need to be used, thereby allowing the conductive contact pads to be sized smaller and/or fewer in number.

Implementation 1: A light-emitting diode (LED) lighting strip assembly, comprising: a first LED board that includes: a first printed circuit board (PCB) substrate with a first side and a second side opposite the first side of the first PCB substrate, a plurality of LEDs located on the first side of the first PCB substrate, wherein each LED emits light away from the first side of the first LED board, an end portion, and a plurality of compressible electrically conductive members that each extend outward from the second side of the first PCB substrate; a second LED board that includes: a second PCB substrate with a first side and a second side opposite the first side of the second PCB substrate, a plurality of LEDs located on the first side of the second PCB substrate, wherein each LED emits light away from the first side of the second LED board, an end portion, and a plurality of compressible electrically conductive members that each extend outward from the second side of the second PCB substrate; and an interconnect board that includes a third PCB substrate having a first region and a second region, the third PCB substrate including: a plurality of first electrically conductive pads located on a first side of the third PCB substrate and within the first region of the third PCB substrate, and a plurality of second electrically conductive pads located on the first side of the third PCB substrate and within the second region of the third PCB substrate, wherein each first electrically conductive pad is electrically connected with at least one of the second electrically conductive pads by an electrically conductive trace of the interconnect board, wherein: the end portion of the first LED board is proximate to the end portion of the second LED board, the first side of the third PCB substrate faces the second side of the first LED board and the second side of the second LED board, each compressible electrically conductive member of the first LED board is in electrically conductive contact with a corresponding one of the first electrically conductive pads, each compressible electrically conductive member of the second LED board is in electrically conductive contact with a corresponding one of the plurality of second electrically conductive pads, and a height of the LED lighting strip assembly is, when each compressible electrically conductive member of the first LED board is in electrically conductive contact with the corresponding one of the first electrically conductive pads and each compressible electrically conductive member of the second LED board is in electrically conductive contact with the corresponding one of the second electrically conductive pads, substantially equal to about a sum of: a thickness of the third PCB substrate of the interconnect board, and the greater of the height of the first LED board and the height of the second LED board.

Implementation 2: The LED lighting strip assembly of implementation 1, wherein the compressible electrically conductive members are pogo pins, and each electrically conductive pad of the plurality of first electrically conductive pads and the plurality of second electrically conductive pads is at least larger in area than a cross-sectional area of a plunger of a corresponding pogo pin in the plane of the second side of the LED board in which the pogo pin is mounted.

Implementation 3: The LED lighting strip assembly of any of implementations 1 through 2, wherein each of the compressible electrically conductive members extends at least about 0.9 mm from the second side of either the first LED board or the second LED board.

Implementation 4: The LED lighting strip assembly of any of implementations 1 through 3, further comprising: at least one first hole located in the first region of the third PCB substrate of the interconnect board, at least one second hole located in the second region of the third PCB substrate of the interconnect board, at least one hole located in the first LED board and aligned with the at least one hole located in the first region of the third PCB substrate of the interconnect board; and at least one hole located in the second LED board and aligned with the at least one hole located in the second region of the third PCB substrate of the interconnect board.

Implementation 5: The LED lighting strip assembly of any of implementations 1 through 4, wherein the height of the LED lighting strip assembly is less than about 5.5 mm.

Implementation 6: The LED lighting strip assembly of any of implementations 1 through 5, wherein each compressible electrically conductive member is a spring-loaded pin.

Implementation 7: The LED lighting strip assembly of any of implementations 1 through 6, wherein a width of the end portion of the first LED board and a width of the end portion of the second LED board are both less than about 12 mm.

Implementation 8: The LED lighting strip assembly of any of implementations 1 through 7, wherein the LEDs in each plurality of LEDs are spaced less than or equal to about 12 mm apart center-to-center.

Implementation 9: A printed circuit board (PCB) interconnect assembly, comprising: a first board that includes: a first PCB substrate with a first side and a second side opposite the first side of the first PCB substrate, and a plurality of compressible electrically conductive members that each extend outward from the second side of the first PCB substrate; a second board that includes: a second PCB substrate with a first side and a second side opposite the first side of the second PCB substrate, and a plurality of compressible electrically conductive members that each extend outward from the second side of the second PCB substrate, wherein each compressible electrically conductive member has an outer surface on a side of the compressible electrically conductive member facing away from the first side of the second board; and an interconnect board that includes a third PCB substrate having a first region and a second region, the third PCB substrate including: a plurality of first electrically conductive pads located on a first side of the third PCB substrate and within the first region of the third PCB substrate, and a plurality of second electrically conductive pads located on the first side of the third PCB substrate and within the second region of the third PCB substrate, wherein each first electrically conductive pad is electrically connected with at least one of the second electrically conductive pads by an electrically conductive trace of the interconnect board, wherein: each compressible electrically conductive member of the first board is in electrically conductive contact with a corresponding one of the first electrically conductive pads, each compressible electrically conductive member of the second board is in electrically conductive contact with a corresponding one of the plurality of second electrically conductive pads, and a height of the PCB interconnect assembly is, when each compressible electrically conductive member of the first board is in electrically conductive contact with the corresponding one of the first electrically conductive pads and each compressible electrically conductive member of the second board is in electrically conductive contact with the corresponding one of the second electrically conductive pads, substantially equal to about a sum of: a thickness of the third PCB substrate of the interconnect board, and the greater of the height of the first LED board and the height of the second LED board.

Implementation 10: The PCB interconnect assembly of implementation 9, wherein the compressible electrically conductive members are pogo pins, and each electrically conductive pad of the plurality of first electrically conductive pads and the plurality of second electrically conductive pads is at least larger in area than a cross-sectional area of a plunger of a corresponding pogo pin in the plane of the second side of the board in which the pogo pin is mounted.

Implementation 11: The PCB interconnect assembly of any of implementations 9 through 10, wherein each of the compressible electrically conductive members extend at least about 0.9 mm from the second side of either the first board or the second board.

Implementation 12: The PCB interconnect assembly of any of implementations 9 through 11, further comprising: at least one first hole located in the first region of the third PCB substrate of the interconnect board, at least one second hole located in the second region of the third PCB substrate of the interconnect board, at least one hole located in the first board and aligned with the at least one hole located in the first region of the third PCB substrate of the interconnect board; and at least one hole located in the second board and aligned with the at least one hole located in the second region of the third PCB substrate of the interconnect board.

Implementation 13: The PCB interconnect assembly of any of implementations 9 through 12, wherein the height of the PCB interconnect assembly in a direction perpendicular to the first side of the third PCB substrate is less than about 5.5 mm.

Implementation 14: The PCB interconnect assembly of any of implementations 9 through 13, wherein each compressible electrically conductive member is a spring-loaded pin.

Implementation 15: The PCB interconnect assembly of any of implementations 9 through 14, wherein a width of the first board and a width of the second board are both less than about 12 mm.

Implementation 16: A method of assembling an LED lighting strip assembly, comprising: placing an interconnect board having a first printed circuit board (PCB) substrate onto a supporting structure, wherein: the first PCB substrate has a first electrically conductive pad located on a first side of the first PCB substrate within a first region of the first PCB substrate and a second electrically conductive pad located on the first side of the first PCB substrate within a second region of the first PCB substrate, and the first electrically conductive pad is electrically connected with the second electrically conductive pad by an electrically conductive trace of the interconnect board; placing a first LED board having a second PCB substrate with one or more LEDs located on a first side thereof such that a second side of the second PCB substrate opposite the first side of the second PCB substrate is proximate to the first side of the first PCB substrate of the interconnect board and such that a first compressible electrically conductive member extending outward from the second side of the first LED board is in electrically conductive contact with the first electrically conductive pad; placing a second LED board having a third PCB substrate with one or more LEDs located on a first side thereof such that a second side of the third PCB substrate opposite the first side of the third PCB substrate is proximate to the first side of the first PCB substrate and such that a second compressible electrically conductive member extending outward from the second side of the second LED board is in electrically conductive contact with the second electrically conductive pad; and applying one or more compressive forces to the first LED board and the second LED board to mechanically couple the first LED board and the second LED board to at least one of the interconnect board or a support structure.

Implementation 17: The method of implementation 16, wherein the first compressible electrically conductive member and second compressible electrically conductive member are pogo pins, and each electrically conductive pad of the first electrically conductive pad and the second electrically conductive pad are at least larger in area than a cross-sectional area of a plunger of a corresponding pogo pin in the plane of the second side of the LED board in which the pogo pin is mounted.

Implementation 18: The method of any of implementations 16 through 17, wherein the first compressible electrically conductive member and the second compressible electrically conductive member extend at least about 0.9 mm from the second side of either the first LED board or the second LED board.

Implementation 19: The method of any of implementations 16 through 18, wherein the one or more LEDs of the first LED board and the one or more LEDs of the second LED board are spaced less than or equal to about 12 mm apart center-to-center.

Implementation 20: The method of any of implementations 16 through 19, wherein a height of the LED lighting strip assembly is, when the first compressible electrically conductive member of the first LED board is in electrically conductive contact with the first electrically conductive pad and the second compressible electrically conductive member of the second LED board is in electrically conductive contact with the second electrically conductive pad, substantially equal to about a sum of: a thickness of the first PCB substrate of the interconnect board, and the greater of the height of the first LED board and the height of the second LED board.

CONCLUSION

The foregoing description is provided to enable a person skilled in the art to practice the various configurations described herein. While the subject technology has been particularly described with reference to the various figures and configurations, it should be understood that these are for illustration purposes only and should not be taken as limiting the scope of the subject technology.

Terms such as "about," "approximately," "substantially," "nominal," or the like, when used in reference to quantities or similar quantifiable properties, are to be understood to be inclusive of values within ±10% of the values specified, unless otherwise indicated. In some instances, the terms can be inclusive of values less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

It is also to be understood that any use of ordinal indicators, e.g., (a), (b), (c), . . . , herein is for organizational purposes only, and is not intended to convey any particular sequence or importance to the items associated with each ordinal indicator. There may nonetheless be instances in which some items associated with ordinal indicators may inherently use a particular sequence, e.g., "(a) obtain information regarding X, (b) determine Y based on the information regarding X, and (c) obtain information regarding Z"; in this example, (a) would be performed before (b) since (b) relies on information obtained in (a)-(c), however, could be performed before or after either of (a) and/or (b).

It is to be further understood that use of the word "each," such as in the phrase "for each <item> of the one or more <items>" or "of each <item>," if used herein, should be understood to be inclusive of both a single-item group and multiple-item groups, i.e., the phrase "for . . . each" is used in the sense that it is used in programming languages to refer to each item of whatever population of items is referenced. For example, if the population of items referenced is a single item, then "each" would refer to only that single item (despite the fact that dictionary definitions of "each" frequently define the term to refer to "every one of two or more things") and would not imply that there must be at least two of those items. Similarly, when a selected item may have one or more sub-items and a selection of one of those sub-items is made, it will be understood that in the case where the selected item has one and only one sub-item, selection of that one sub-item is inherent in the selection of the item itself.

There may be many other ways to implement the subject technology. Various functions and elements described herein may be partitioned differently from those shown without departing from the scope of the subject technology. Various modifications to these implementations may be readily apparent to those skilled in the art, and generic principles defined herein may be applied to other implementations. Thus, many changes and modifications may be made to the subject technology, by one having ordinary skill in the art, without departing from the scope of the subject technology. For instance, different numbers of a given module or unit may be employed, a different type or types of a given module or unit may be employed, a given module or unit may be added, or a given module or unit may be omitted.

Underlined and/or italicized headings and subheadings are used for convenience only, do not limit the subject technology, and are not referred to in connection with the interpretation of the description of the subject technology. All structural and functional equivalents to the elements of the various implementations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments and/or may be combined to achieve the particular benefits of a particular aspect. Accordingly, the present embodiments are to be considered as illustrative and not restrictive, and the embodiments are not to be limited to the details given herein.

The invention claimed is:

1. A light-emitting diode (LED) lighting strip assembly, comprising:
  a first LED board that includes:
    a first printed circuit board (PCB) substrate with a first side and a second side opposite the first side of the first PCB substrate,
    a plurality of LEDs located on the first side of the first PCB substrate, wherein each LED emits light away from the first side of the first LED board,
    an end portion, and
    a plurality of compressible electrically conductive members that each extend outward from the second side of the first PCB substrate and are compressible along an axis perpendicular to the second side of the first PCB substrate;
  a second LED board that includes:
    a second PCB substrate with a first side and a second side opposite the first side of the second PCB substrate,
    a plurality of LEDs located on the first side of the second PCB substrate, wherein each LED emits light away from the first side of the second LED board,
    an end portion, and
    a plurality of compressible electrically conductive members that each extend outward from the second side of the second PCB substrate and are compressible along an axis perpendicular to the second side of the second PCB substrate; and
  an interconnect board that includes a third PCB substrate having a first region and a second region, the third PCB substrate including:
    a plurality of first electrically conductive pads located on a first side of the third PCB substrate and within the first region of the third PCB substrate, and
    a plurality of second electrically conductive pads located on the first side of the third PCB substrate and within the second region of the third PCB substrate, wherein each first electrically conductive pad is electrically connected with at least one of the second electrically conductive pads by an electrically conductive trace of the interconnect board,
  wherein:
    the end portion of the first LED board is proximate to the end portion of the second LED board,
    the first side of the third PCB substrate faces the second side of the first LED board and the second side of the second LED board,
    each compressible electrically conductive member of the first LED board is in electrically conductive contact with a corresponding one of the first electrically conductive pads,
    each compressible electrically conductive member of the second LED board is in electrically conductive contact with a corresponding one of the plurality of second electrically conductive pads, and
    a height of the LED lighting strip assembly is, when each compressible electrically conductive member of the first LED board is in electrically conductive contact with the corresponding one of the first electrically conductive pads and each compressible electrically conductive member of the second LED board is in electrically conductive contact with the corresponding one of the second electrically conductive pads, substantially equal to about a sum of:
      a thickness of the third PCB substrate of the interconnect board, and
      the greater of the height of the first LED board and the height of the second LED board.

2. The LED lighting strip assembly of claim 1, wherein the compressible electrically conductive members are pogo pins, and each electrically conductive pad of the plurality of first electrically conductive pads and the plurality of second electrically conductive pads is at least larger in area than a cross-sectional area of a plunger of a corresponding pogo pin in the plane of the second side of the LED board in which the pogo pin is mounted.

3. The LED lighting strip assembly of claim 1, wherein each of the compressible electrically conductive members extends at least about 0.9 mm from the second side of either the first LED board or the second LED board.

4. The LED lighting strip assembly of claim 1, further comprising:
   at least one first hole located in the first region of the third PCB substrate of the interconnect board,
   at least one second hole located in the second region of the third PCB substrate of the interconnect board,
   at least one hole located in the first LED board and aligned with the at least one hole located in the first region of the third PCB substrate of the interconnect board; and
   at least one hole located in the second LED board and aligned with the at least one hole located in the second region of the third PCB substrate of the interconnect board.

5. The LED lighting strip assembly of claim 1, wherein the height of the LED lighting strip assembly is less than about 5.5 mm.

6. The LED lighting strip assembly of claim 1, wherein each compressible electrically conductive member is a spring-loaded pin.

7. The LED lighting strip assembly of claim 1, wherein a width of the end portion of the first LED board and a width of the end portion of the second LED board are both less than about 12 mm.

8. The LED lighting strip assembly of claim 1, wherein the LEDs in each plurality of LEDs are spaced less than or equal to about 12 mm apart center-to-center.

9. A printed circuit board (PCB) interconnect assembly, comprising:
   a first board that includes:
      a first PCB substrate with a first side and a second side opposite the first side of the first PCB substrate, and
      a plurality of compressible electrically conductive members that each extend outward from the second side of the first PCB substrate and are compressible along an axis perpendicular to the second side of the first PCB substrate;
   a second board that includes:
      a second PCB substrate with a first side and a second side opposite the first side of the second PCB substrate and are compressible along an axis perpendicular to the second side of the second PCB substrate, and
      a plurality of compressible electrically conductive members that each extend outward from the second side of the second PCB substrate, wherein each compressible electrically conductive member has an outer surface on a side of the compressible electrically conductive member facing away from the first side of the second board; and
   an interconnect board that includes a third PCB substrate having a first region and a second region, the third PCB substrate including:
      a plurality of first electrically conductive pads located on a first side of the third PCB substrate and within the first region of the third PCB substrate, and
      a plurality of second electrically conductive pads located on the first side of the third PCB substrate and within the second region of the third PCB substrate, wherein each first electrically conductive pad is electrically connected with at least one of the second electrically conductive pads by an electrically conductive trace of the interconnect board,
   wherein:
      each compressible electrically conductive member of the first board is in electrically conductive contact with a corresponding one of the first electrically conductive pads,
      each compressible electrically conductive member of the second board is in electrically conductive contact with a corresponding one of the plurality of second electrically conductive pads, and
      a height of the PCB interconnect assembly is, when each compressible electrically conductive member of the first board is in electrically conductive contact with the corresponding one of the first electrically conductive pads and each compressible electrically conductive member of the second board is in electrically conductive contact with the corresponding one of the second electrically conductive pads, substantially equal to about a sum of:
         a thickness of the third PCB substrate of the interconnect board, and
         the greater of the height of the first LED board and the height of the second LED board.

10. The PCB interconnect assembly of claim 9, wherein the compressible electrically conductive members are pogo pins, and each electrically conductive pad of the plurality of first electrically conductive pads and the plurality of second electrically conductive pads is at least larger in area than a cross-sectional area of a plunger of a corresponding pogo pin in the plane of the second side of the board in which the pogo pin is mounted.

11. The PCB interconnect assembly of claim 9, wherein each of the compressible electrically conductive members extend at least about 0.9 mm from the second side of either the first board or the second board.

12. The PCB interconnect assembly of claim 9, further comprising:
   at least one first hole located in the first region of the third PCB substrate of the interconnect board,
   at least one second hole located in the second region of the third PCB substrate of the interconnect board,
   at least one hole located in the first board and aligned with the at least one hole located in the first region of the third PCB substrate of the interconnect board; and
   at least one hole located in the second board and aligned with the at least one hole located in the second region of the third PCB substrate of the interconnect board.

13. The PCB interconnect assembly of claim 9, wherein the height of the PCB interconnect assembly is less than about 5.5 mm.

14. The PCB interconnect assembly of claim 9, wherein each compressible electrically conductive member is a spring-loaded pin.

15. The PCB interconnect assembly of claim 9, wherein a width of the first board and a width of the second board are both less than about 12 mm.

16. A method of assembling an LED lighting strip assembly, comprising:
   placing an interconnect board having a first printed circuit board (PCB) substrate onto a supporting structure, wherein:
      the first PCB substrate has a first electrically conductive pad located on a first side of the first PCB substrate within a first region of the first PCB substrate and a second electrically conductive pad located on the first side of the first PCB substrate within a second region of the first PCB substrate, and the first electrically conductive pad is electrically connected with the second electrically conductive pad by an electrically conductive trace of the interconnect board;

placing a first LED board having a second PCB substrate with one or more LEDs located on a first side thereof such that a second side of the second PCB substrate opposite the first side of the second PCB substrate is proximate to the first side of the first PCB substrate of the interconnect board and such that a first compressible electrically conductive member extending outward from the second side of the first LED board is in electrically conductive contact with the first electrically conductive pad, wherein the first compressible electrically conductive member is compressible along an axis perpendicular to the second side of the second PCB substrate;

placing a second LED board having a third PCB substrate with one or more LEDs located on a first side thereof such that a second side of the third PCB substrate opposite the first side of the third PCB substrate is proximate to the first side of the first PCB substrate and such that a second compressible electrically conductive member extending outward from the second side of the second LED board is in electrically conductive contact with the second electrically conductive pad, wherein the second compressible electrically conductive member is compressible along an axis perpendicular to the second side of the third PCB substrate; and applying one or more compressive forces to the first LED board and the second LED board to mechanically couple the first LED board and the second LED board to at least one of the interconnect board or a support structure.

17. The method of claim 16, wherein the first compressible electrically conductive member and second compressible electrically conductive member are pogo pins, and each electrically conductive pad of the first electrically conductive pad and the second electrically conductive pad are at least larger in area than a cross-sectional area of a plunger of a corresponding pogo pin in the plane of the second side of the LED board in which the pogo pin is mounted.

18. The method of claim 16, wherein the first compressible electrically conductive member and the second compressible electrically conductive member extend at least about 0.9 mm from the second side of either the first LED board or the second LED board.

19. The method of claim 16, wherein the one or more LEDs of the first LED board and the one or more LEDs of the second LED board are spaced less than or equal to about 12 mm apart center-to-center.

20. The method of claim 16, wherein a height of the LED lighting strip assembly is, when the first compressible electrically conductive member of the first LED board is in electrically conductive contact with the first electrically conductive pad and the second compressible electrically conductive member of the second LED board is in electrically conductive contact with the second electrically conductive pad, substantially equal to about a sum of:

a thickness of the first PCB substrate of the interconnect board, and the greater of the height of the first LED board and the height of the second LED board.

\* \* \* \* \*